(12) United States Patent
Wada

(10) Patent No.: US 7,828,164 B2
(45) Date of Patent: Nov. 9, 2010

(54) SUSPENDED PLATFORM FOR OVERHEAD TRAVELING CARRIAGE

(75) Inventor: Eiji Wada, Aichi (JP)

(73) Assignee: Murata Machinery, Ltd., Kyoto (JP)

( * ) Notice: Subject to any disclaimer, the term of this patent is extended or adjusted under 35 U.S.C. 154(b) by 26 days.

(21) Appl. No.: 12/379,292

(22) Filed: Feb. 18, 2009

(65) Prior Publication Data

US 2009/0206048 A1 Aug. 20, 2009

(30) Foreign Application Priority Data

Feb. 20, 2008 (JP) ............................. 2008-039177

(51) Int. Cl.
*B65G 1/16* (2006.01)
(52) U.S. Cl. .................. 212/331; 414/277; 414/940
(58) Field of Classification Search ............. 212/331; 414/277, 940
See application file for complete search history.

(56) References Cited

U.S. PATENT DOCUMENTS

| 5,363,867 | A | 11/1994 | Kawano et al. |
| 6,468,021 | B1 | 10/2002 | Bonora et al. |
| 2002/0114685 | A1 | 8/2002 | Inui |
| 2003/0229416 | A1 * | 12/2003 | Tai et al. ............... 700/213 |
| 2005/0139564 | A1 | 6/2005 | Nakao et al. |

FOREIGN PATENT DOCUMENTS

| JP | 5-201506 | 8/1993 |
| JP | 2004-059223 | 2/2004 |
| JP | 2004-315191 | 11/2004 |
| JP | 2005-206371 | 8/2005 |

OTHER PUBLICATIONS

European Search Report issued May 6, 2009 in EP application 09 00 2276.5, which is a counterpart to the present application.

* cited by examiner

*Primary Examiner*—Thomas J. Brahan
(74) *Attorney, Agent, or Firm*—Wenderoth, Lind & Ponack, L.L.P.

(57) ABSTRACT

A suspended platform is provided which can prevent an article from overturning and falling even when a great quake such as an earthquake occurs. The suspended platform is intended for an overhead traveling carriage which transfers an article having an abutting surface facing upward in a transfer direction on a horizontal plane and mounts the article on the suspended platform, the suspended platform including a tilt regulating part positioned, in relation to a receiving part on which the article is mounted, such that the tilt regulating part (i) does not touch the article when the article is transferred and mounted on the suspended platform, (ii) is above the abutting surface of the article when the article is transferred and mounted on the suspended platform, (iii) and regulates, by abutting the mounted article at the abutting surface, the tilt range of the article.

15 Claims, 10 Drawing Sheets

SUSPENDED PLATFORM FOR OVERHEAD TRAVELING CARRIAGE

BACKGROUND OF THE INVENTION (1) Field of the Invention

The present invention relates to suspended platforms on which articles conveyed by overhead traveling carriages are mounted, and in particular to suspended platforms which can prevent overturning of articles.

(2) Description of the Related Art

An overhead traveling carriage and suspended platforms for the overhead traveling carriage are arranged such that the overhead traveling carriage can convey an article along a traveling rail and temporarily place the article on the suspended platforms. The article is delivered between the platforms and the overhead traveling carriage. Conventionally proposed platforms include safety members against overturning intended to prevent articles mounted on the platforms from overturning and falling (for example, see Patent Reference: Japanese Unexamined Patent Application Publication No. 2005-206371).

The platforms are provided with side walls having certain heights as safety members against overturning as mentioned above, thereby preventing articles from overturning and falling.

The conventionally proposed suspended platforms have a problem that articles mounted on the platforms overturn and fall when a great quake such as an earthquake occurs. This problem arises because the side walls as the safety members against overturning do not have sufficient heights.

FIGS. 10A to 10C illustrate the problem of the conventional suspended platforms.

In the drawings, the X-axis direction is the transfer direction on the horizontal plane in the case where an overhead traveling carriage mounts an article 500 on suspended platforms 300, and the Y-axis direction is the vertical direction.

As shown in FIG. 10A, the overhead traveling carriage transfers the article 500 in the minus direction of the X-axis and lowers the article 500 in the minus direction of the Y-axis when mounting the article 500 on the platforms 300.

In this case, the time to mount the article 500 can be reduced by reducing the distance ("A" shown in FIG. 10A) by which the article 500 is lowered. With an aim to reduce the distance A, the front walls 320 of the respective platforms 300 are low. The front walls 320 are arranged at the entrance/exit for the article 500 mounted and transferred by the overhead traveling carriage.

As shown in FIG. 10B, the overhead traveling carriage mounts the article 500 on the platforms 300.

As shown in FIG. 10C, the article 500 may overturn and fall when a great quake such as an earthquake occurs. In particular, in the case where the article 500 tilts in the direction of the front wall 320 of either one of the platforms 300, the article 500 overturns toward the front wall 320 and then fall over the low front wall 320.

As described above, the conventional suspended platforms have a problem that articles mounted on the platforms overturn and fall sometimes.

SUMMARY OF THE INVENTION

The present invention has been made in view of this problem, and has an aim to provide a suspended platform which can prevent an article mounted by an overhead traveling carriage from overturning and falling even when a great quake such as an earthquake occurs.

In order to achieve the aforementioned aim, the suspended platform according to the present invention is intended for an overhead traveling carriage which transfers an article having an abutting surface facing upward in a transfer direction on a horizontal plane when traveling along a traveling rail fixed on a ceiling and mounts the article on the suspended platform, the suspended platform including a tilt regulating part positioned, in relation to a receiving part on which the article is mounted, such that the tilt regulating part (i) does not touch the article when the article is transferred and mounted on the suspended platform, (ii) is above the abutting surface of the article when the article is transferred and mounted on the suspended platform, (iii) and regulates, by abutting the mounted article at the abutting surface, the tilt range of the article.

With this, the article conveyed by the overhead traveling carriage is transferred without touching the tilt regulating part. This makes it possible to prevent the article from overturning and falling because the tilt regulating part regulates the tilt range of the article by abutting the abutting surface of the article when the article tilts in the case where a great quake such as an earthquake occurs.

It is preferable that the receiving part includes an upper surface having convex portions interfit with concave portions formed on the bottom surface of the article.

This makes it possible to prevent the article from slipping over the receiving part of the suspended platform when a great quake such as an earthquake occurs. In other words, it becomes possible to prevent the article from slipping to a position where the tilt regulating part cannot regulate the tilt range of the article.

It is preferable that the article includes two abutting surfaces respectively formed in relation to opposing side surfaces of the article, and that two tilt regulating parts are respectively positioned in relation to the abutting surfaces.

Each of these two tilt regulating parts which is placed along the corresponding one of the side surfaces of the article can prevent the article from overturning and falling when the article tilts in the corresponding one of the directions of the side surfaces.

It is preferable that the tilt regulating part is placed at a position in the depth direction of the suspended platform in the transfer direction.

The tilt regulating part placed in this way can prevent the article from overturning and falling by abutting the abutting surface when the article tilts in the front wall direction even when the tilt regulating part is short in the transfer direction. It is preferable that the abutting surface is a portion of an upper surface of a protruding part formed on a side surface of the article.

When the article has a protruding part formed at a position predetermined by standards or the like, the tilt regulating part can be positioned to interfit with the protruding part. In other words, it is possible to prevent articles having various shapes from overturning and falling as long as each of the articles has a protruding part at the predetermined position.

It is preferable (i) that the suspended platform further comprises: a fixing part which is plate-shaped, and fixed in relation to the receiving part; and a tie part which is plate-shaped, and stands on the fixing part, (ii) that the tilt regulating part is plate-shaped, extends in a horizontal direction, and is connected to an upper end of the tie part, and (iii) that the fixing part, the tie part, and the tilt regulating part are integrally formed.

The safety member against overturning can be formed by simply bending a plate material to integrally form three portions corresponding to the fixing part, tie part, and tilt regulating part. It is easy to form such safety member against overturning having a simple shape.

With the tilt regulating part, the suspended platform can prevent the article mounted by the overhead traveling carriage from overturning and falling even when a great quake such as an earthquake occurs.

The suspended platforms according to the present invention can prevent the article mounted by the overhead traveling carriage from overturning and falling even when a great quake such as an earthquake occurs. Therefore, the present invention is highly practical.

FURTHER INFORMATION ABOUT TECHNICAL BACKGROUND TO THIS APPLICATION

The disclosure of Japanese Patent Application No. 2008-039177 filed on Feb. 20, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

An embodiment according to the present invention is described in detail below with reference to the drawings.

Figure 1:
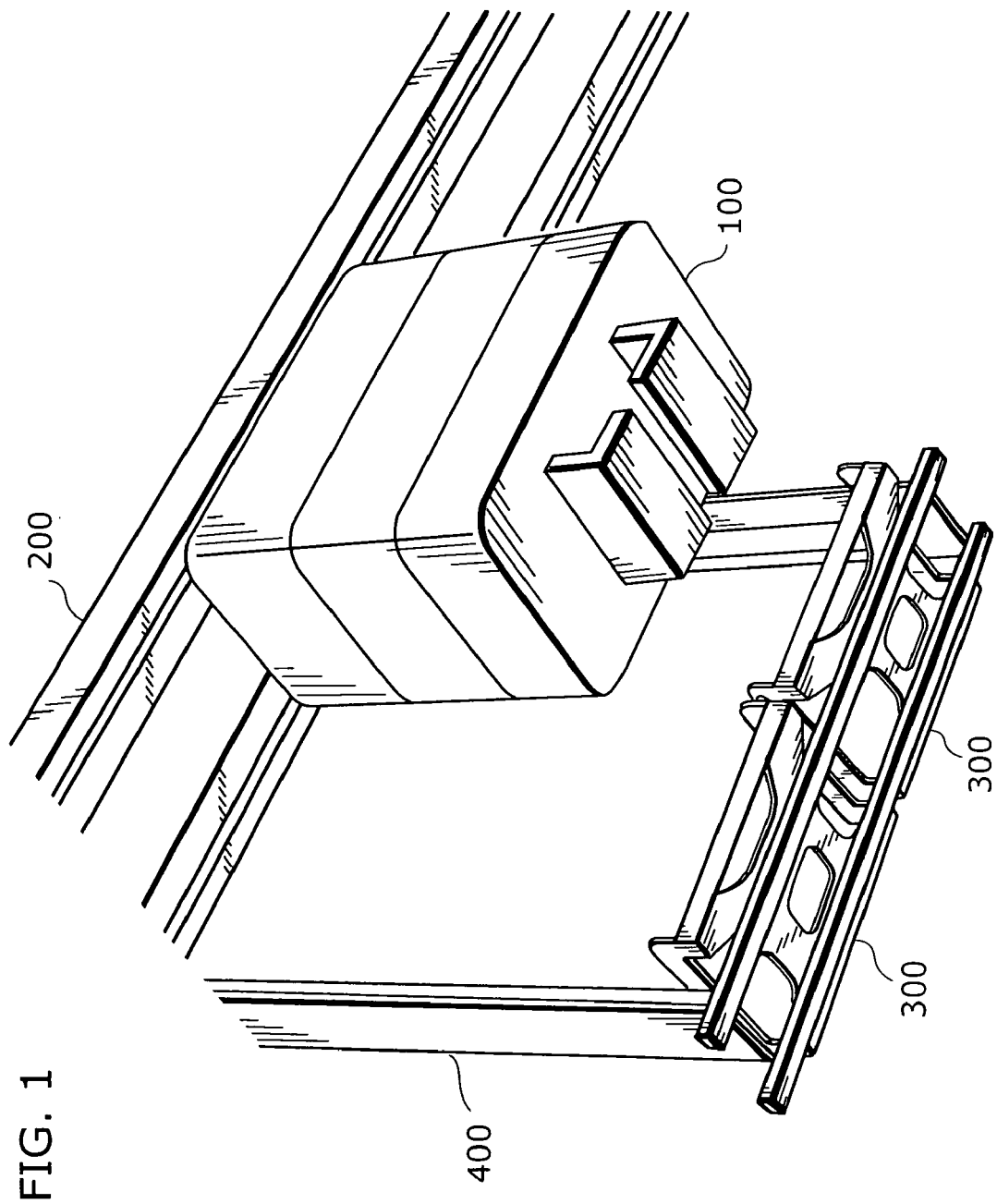
FIG. 1 is a perspective view showing appearance of an overhead traveling carriage and suspended platforms for the overhead traveling carriage in an embodiment according to the present invention.

FIG. 1 is a perspective view showing appearance of an overhead traveling carriage 100 and suspended platforms 300 for the overhead traveling carriage 100 in this embodiment according to the present invention.

The overhead traveling carriage 100 is a device for conveying an article when traveling along a traveling rail 200. The platforms 300 are provided for mounting of the article conveyed by the overhead traveling carriage 100. Here, two platforms 300 are provided. These platforms 300 are arranged side-by-side and suspended by suspension parts 400 each having an upper end fixed on a ceiling. The platforms 300 are arranged along a traveling rail 200 such that an article can be conveyed along the traveling rail 200 and temporarily placed on the platforms 300.

Figure 2A:
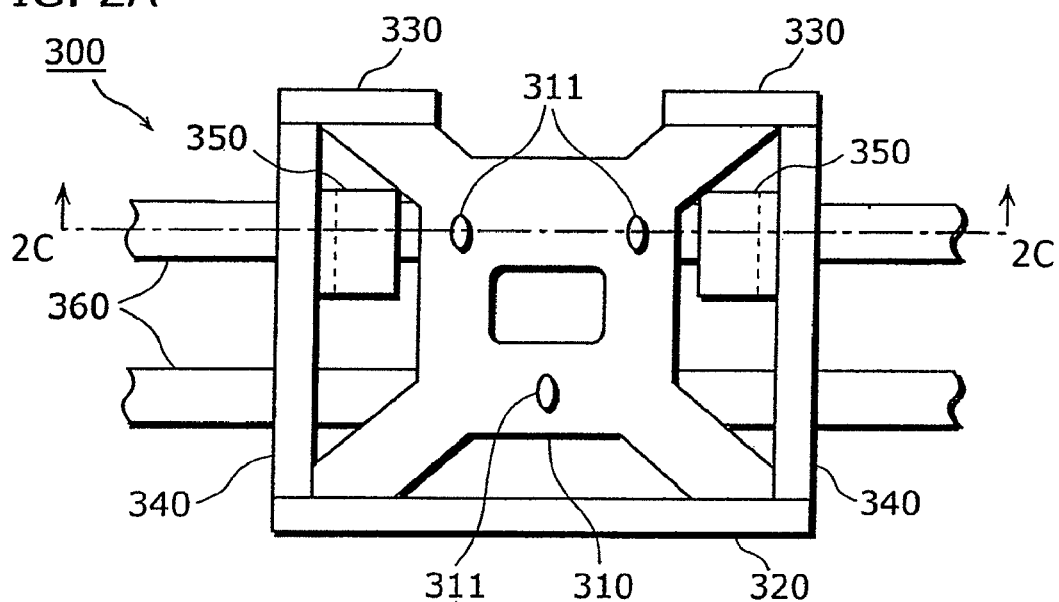
FIG. 2A is a diagram showing the structure of one of the platforms for the overhead traveling carriage in the embodiment.
Figure 2B:
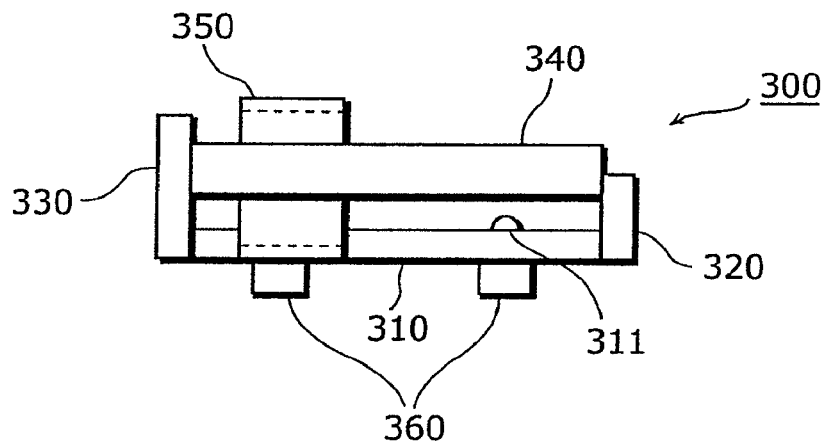
FIG. 2B is a diagram showing the structure of the platform in the embodiment.
Figure 2C:
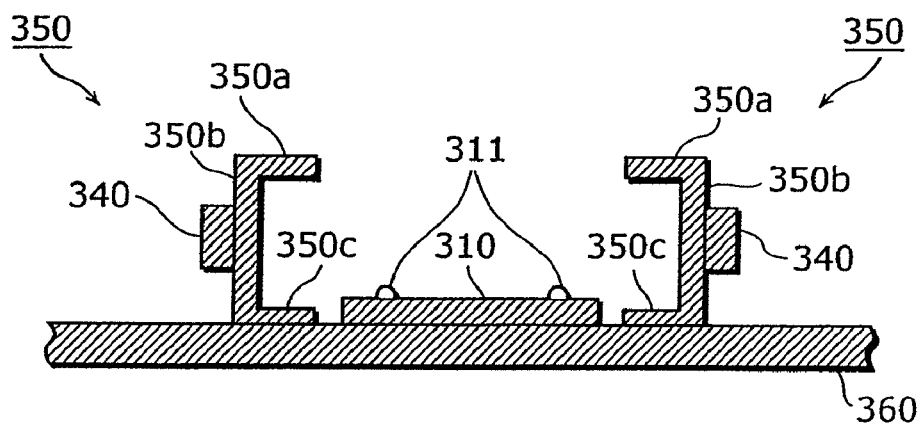
FIG. 2C is a diagram showing the structure of the platform in the embodiment.

Each of FIGS. 2A to 2C is a diagram showing the structure of one of the platforms 300 in this embodiment according to the present invention.

FIG. 2A is a plan view schematically showing the structure of the platform 300. FIG. 2B is a side view of the platform 300 shown in FIG. 2A when seen from the left side of FIG. 2A.

Each platform 300 includes a receiving part 310, a front wall 320, depth walls 330, side walls 340, safety members against overturning 350, and is fixed by beams 360 suspended by the suspension parts 400.

The receiving part 310 is intended to support the article from below when the article is mounted. The receiving part 310 includes three convex portions 311 on its upper surface. These convex portions 311 are arranged to interfit with three concave portions formed on the bottom surface of the article. The shapes and sizes of the convex portions 311 may be any as long as they interfit with the convex portions, respectively. Here, each of the exemplary convex portions 311 is formed to have a round upper periphery. The arrangement of the convex portions 311 positions the article accurately.

The front wall 320 is intended to prevent falling of the article mounted on the platform 300. The front wall 320 is a wall which stands on the front border of the receiving part 310, that is, is placed at the entrance/exit for the article 500 mounted by the overhead traveling carriage 100. The front wall 320 is made lower than the depth walls 330 in order to reduce the time for elevation and lowering at the time of delivery.

The depth walls 330 are intended to prevent falling of the article mounted on the platform 300. The depth walls 330 are walls which stand on the depth border of the receiving part 310, that is, which are arranged at the deepest positions in the platform in the transfer direction. In other words, the depth walls 330 are arranged opposite to the front wall 320 placed around the entrance/exit for the article 500.

The side walls 340 are intended to prevent falling of the article mounted on the platform 300. The side walls 340 are the side surfaces of the platform 300 adjoining to the front wall 320 and the depth walls 330. The platform 300 includes two side walls 340.

The safety members against overturning 350 are intended to prevent falling of the article mounted on the platform 300. The safety members against overturning 350 are rigid bodies made of metal. The safety members against overturning 350 are two in number, and arranged to abut the respective side walls 340 and arranged at positions in the depth direction of the platform 300 in the transfer direction. Each of the safety members against overturning 350 is fixed on the beam 360 for fixing the receiving part 310 of the platform 300. More specifically, the safety member against overturning 350 is screw-fixed on the beam 360 fixed on the lower ends of the suspension parts 400 (not shown in FIG. 2A and FIG. 2B).

FIG. 2C is a cross-sectional view of the platform 300 shown in FIG. 2A when cut along the line 2C-2C.

Each of the safety members against overturning 350 includes a tilt regulating part 350a, a tie part 350b, and a fixing part 350c.

The fixing part 350c is plate-shaped, and is intended to screw-fix the safety member against overturning 350 on the beam 360. More specifically, an oval-shaped hole (not shown) is formed on the fixing part 350c, and the fixing part 350c is screw-fixed on the beam 360 through the oval-shaped hole. Thus, it is easy to adjust the position at which the safety member against overturning 350 is fixed.

The tie part 350b is plate-shaped, and is fixed to vertically abut the fixing part 350c.

The tilt regulating part 350a is plate-shaped, fixed on the receiving part 310, and extends in the approximately horizontal direction. More specifically, the tilt regulating part 350a is connected to the upper end of the tie part 350b.

In other words, the safety member against overturning 350 is a U-shaped member formed by the tilt regulating part 350a, the tie part 350b, and the fixing part 350c integrated with one another. It is easy to form such safety member against overturning having a simple U-shape. For example, it can be formed by bending a metal plate material. As shown in FIG. 2C, two safety members against overturning 350 are arranged opposite to each other.

It is to be noted that the positions of the tilt regulating part 350a, tie part 350b, and fixing part 350c of each safety member against overturning 350 and the size thereof are described later with reference to FIGS. 5A to 5C, and FIGS. 7A and 7B.

Figure 3:
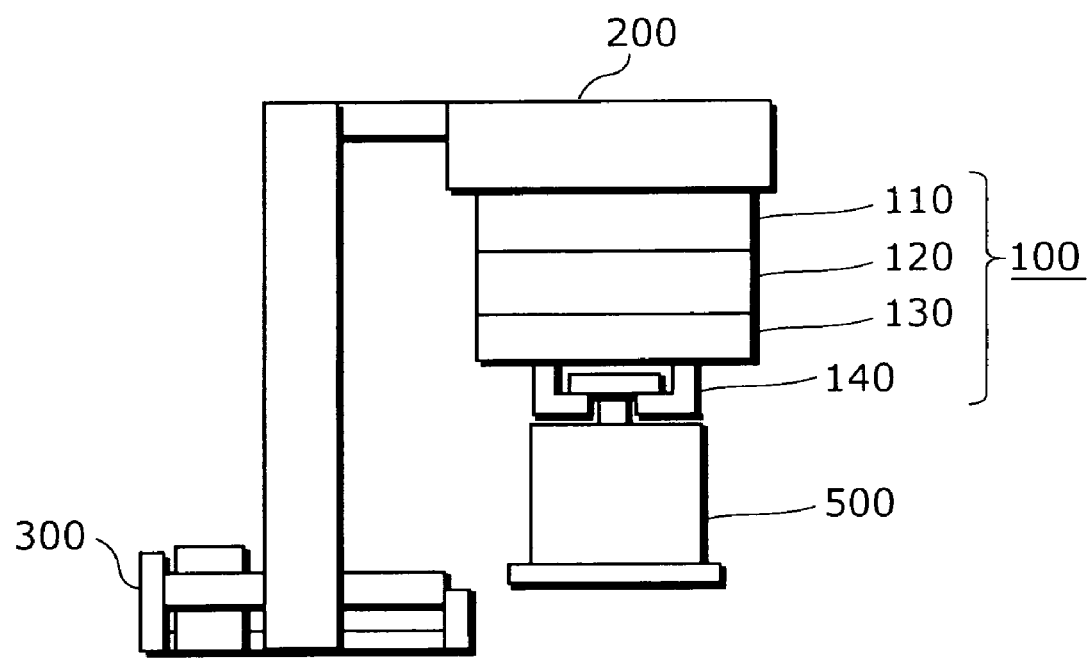
FIG. 3 is a side view schematically showing the structure of the overhead traveling carriage in the embodiment.
Figure 3:
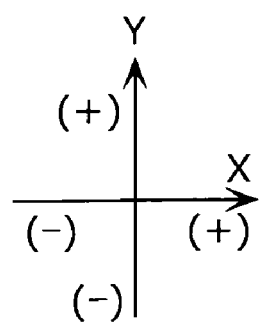

FIG. 3 is a side view schematically showing the structure of the overhead traveling carriage 100 in this embodiment according to the present invention.

The overhead traveling carriage 100 conveys and transfers the article 500 to the platform 300. The overhead traveling carriage 100 includes a traveling unit 110, a delivery unit 120, an elevating unit 130, and a holding unit 140. Here, it is assumed that the transfer direction on the horizontal plane at the time when the overhead traveling carriage 100 mounts the article 500 on the platform 300 is the X-axis direction and the vertical direction is the Y-axis direction. The overhead traveling carriage 100 conveys the article 500 when traveling in the direction perpendicular to the X-Y plane.

The traveling unit 110 is intended to travel along the traveling rail 200.

The delivery unit 120 is intended to move the article 500 in the minus direction of the X-axis in order to mount the article 500 on the platform 300, and position the article 500 above the platform 300. The delivery unit 120 is further intended to move the article 500 positioned above the platform 300 in the plus direction of the X-axis in order to receive the article 500.

The elevating unit 130 is intended to elevate the article 500 in the Y-axis direction and receive the article 500 on the platform 300. The elevating unit 130 is further intended to lower the article 500 in the Y-direction and mount the article 500 on the platform 300.

The holding unit 140 is intended to hold the article 500.

Figure 4:
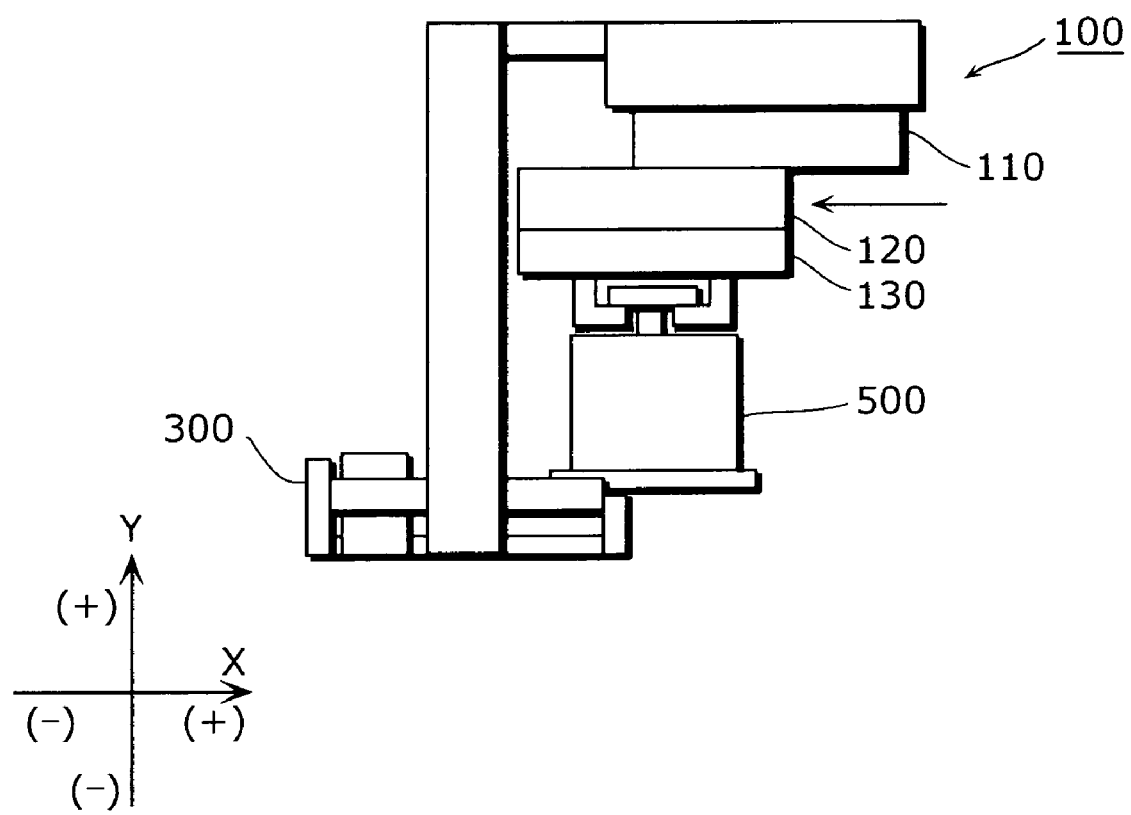
FIG. 4 is a side view illustrating operations performed by the overhead traveling carriage in the embodiment.

FIG. 4 is a side view illustrating operations of the overhead traveling carriage in this embodiment according to the present invention.

First, as shown in FIG. 3, the holding unit 140 holds the article 500. Subsequently, the traveling unit 110 travels along the traveling rail 200 and stops in front of the platform 300.

Next, as shown in FIG. 4, the delivery unit 120 moves the article 500 to the platform 300. The article 500 is held by the holding unit 140 of the overhead traveling carriage 100 such that the bottom of the article 500 is higher than the upper surface of the front wall 320 of the platform 300.

After the delivery unit 120 moves the article 500 above the platform 300, the elevating unit 130 lowers the article 500, and mounts it on the platform 300.

It is also good that the elevating unit 130 of the overhead traveling carriage 100 lowers the article 500 so that the bottom of the article 500 becomes higher than the upper surface of the front wall 320 of the platform 300, and then the delivery unit 120 moves the article 500 above the platform 300.

Figure 5A:
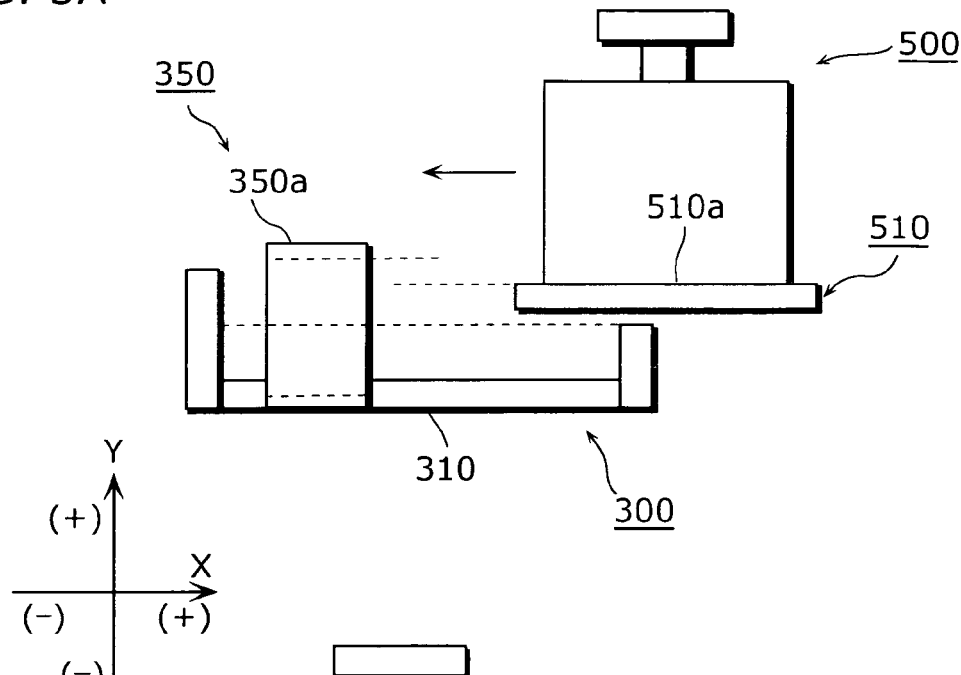
FIG. 5A is a diagram illustrating an operation for mounting an article on the platform, and a platform position at which the safety member against overturning is placed.
Figure 5B:
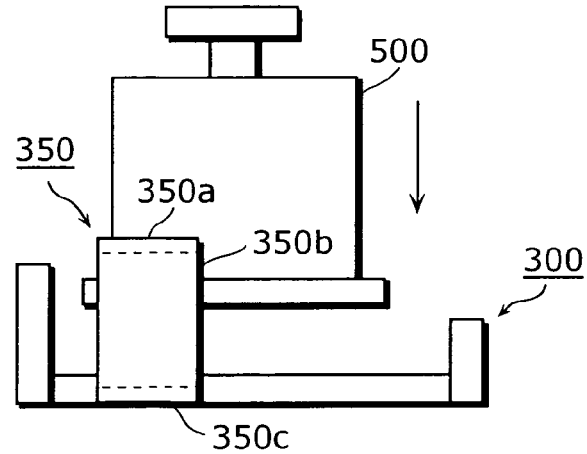
FIG. 5B is a diagram illustrating the operation for mounting the article on the platform, and the platform position at which safety member against overturning is placed.
Figure 5C:
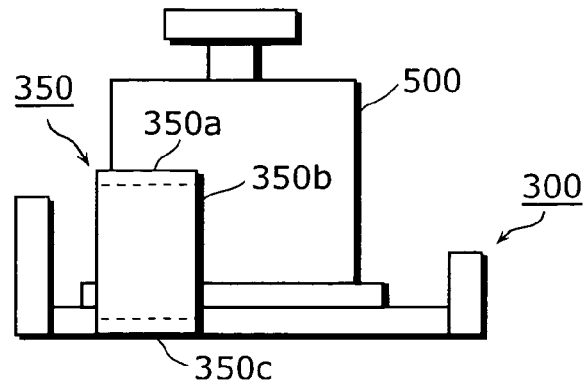
FIG. 5C is a diagram illustrating the operation for mounting the article on the platform, and the platform position at which safety member against overturning is placed.

Each of FIGS. 5A to 5C is a diagram illustrating an operation of mounting the article 500 on the platform 300 and a position at which the safety member against overturning of the platform 300 is placed. For convenience, the side walls 340 are not shown in each of FIGS. 5A to 5C.

As shown in FIG. 5A, the article 500 is rectangular-shaped. The article 500 has abutting surfaces 510a facing upward, and has a protruding part 510 on the lower-most part of the side surface of the article 500. The abutting surfaces 510a are portions of the upper surface of the protruding part 510 formed on the side surface. In other words, the upper surface of the protruding part 510 of the article 500 includes the abutting surfaces 510a facing upward and has a predetermined height.

The article 500 is stopped in front of the platform 300 through the operation performed by the traveling unit 110 of the overhead traveling carriage 100. The article 500 is placed such that the bottom of the article 500 is higher than the upper surface of the front wall 320 of the platform 300. The article 500 is moved, by the delivery unit 120 of the overhead traveling carriage 100, toward the platform 300 in the minus direction of the X-axis which approximately corresponds to the transfer direction on the horizontal plane.

At this time, the tilt regulating part 350a is placed above the corresponding one of the abutting surfaces 510a of the article 500 while the article 500 is being transferred. Here, the tilt regulating part 350*a* is placed at a position that is sufficiently higher than the abutting surface 510*a* so that the tilt regulating part 350*a* does not touch the abutting surface 510*a* even in the case where the tilt regulating part 350*a* sways. Preferably, the tilt regulating part 350*a* is set at the lowest position in which the tilt regulating part 350*a* will not touch the abutting surface 510*a*.

As shown in FIG. 5B, the article 500 is moved above the platform 300, and then lowered by the elevating unit 130 of the overhead traveling carriage 100.

As shown in FIG. 5C, the article 500 is mounted on the platform 300.

In other words, the article 500 is transferred in the transfer direction, lowered, and mounted on the platform 300. In this way, when the article 500 is transferred and mounted, the tilt regulating part 350*a* is placed so as not to touch the article 500. Likewise, the tie part 350*b* and the fixing part 350*c* are arranged so as not to touch the article 500.

Figure 6A:
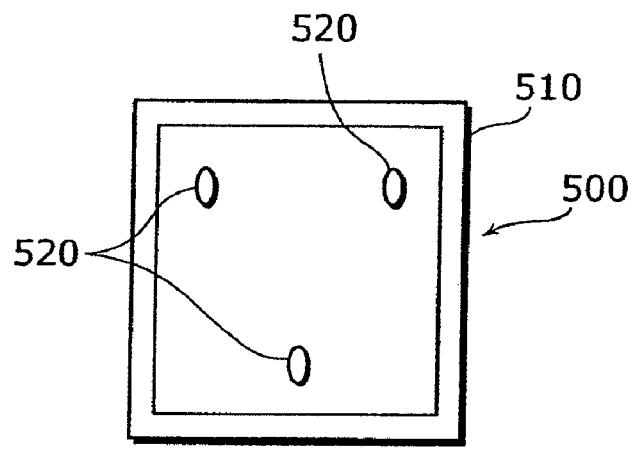
FIG. 6A is a diagram illustrating convex portions of a receiving part of the platform in the embodiment.
Figure 6B:
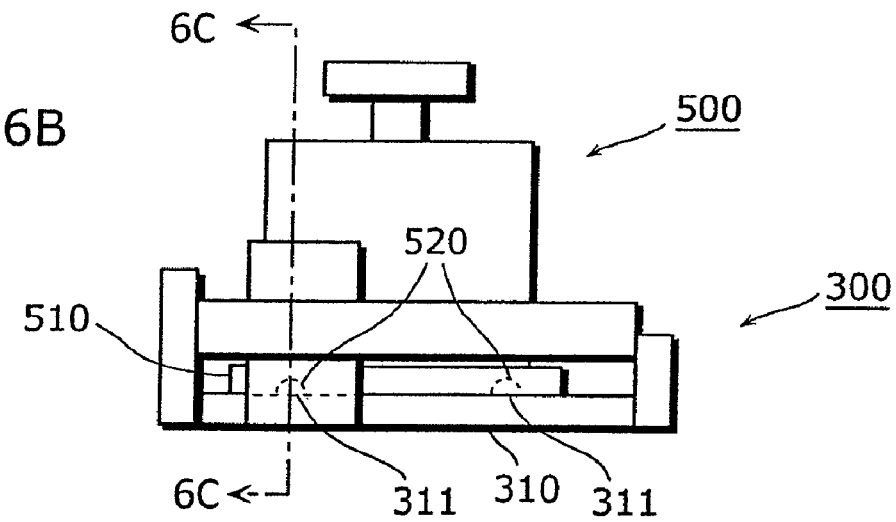
FIG. 6B is a diagram illustrating the convex portions of the receiving part of the platform in the embodiment.
Figure 6C:
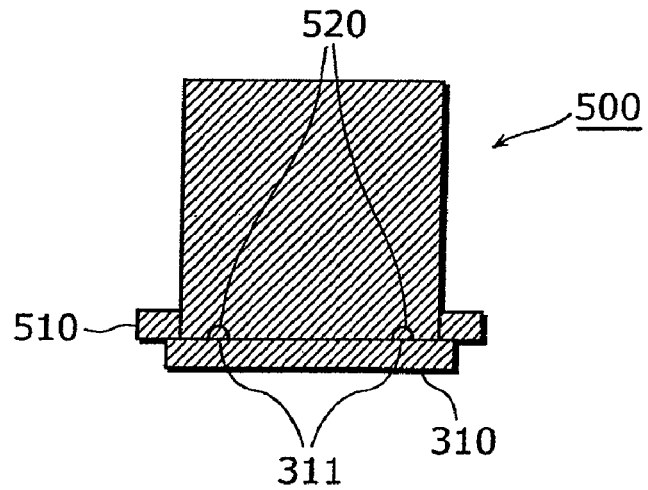
FIG. 6C is a diagram illustrating the convex portions of the receiving part of the platform in the embodiment.

Each of FIGS. 6A to 6C is a diagram illustrating convex portions 311 of the receiving part 310 of the platform 300 in this embodiment according to the present invention.

FIG. 6A is a view of the article 500 when seen from the bottom surface of the article 500. As shown in FIG. 6A, the article 500 has concave portions 520 on the bottom surface.

FIG. 6B is a side view of the article 500 mounted on the platform 300. FIG. 6C is a cross-sectional view of the platform 300 and the article 500 shown in FIG. 6C when cut along the line 6C-6C. For convenience, the side walls 340 and the safety members against overturning 350 are not shown in FIG. 6C.

As shown in FIGS. 6B and 6C, the article 500 is mounted on the platform 300 such that three concave portions 520 on the bottom surface of the article 500 interfit with three convex portions 311 of the receiving part 310 of the platform 300, respectively. The article 500 is precisely positioned when the three concave portions 520 interfit with the three convex portions 311, respectively.

In this way, it is possible to prevent the article 500 from slipping over the receiving part 310 of the platform 300. Further, even when the interfit of the convex portions 311 and the concave portions 520 is released, the article 500 abuts either one of the front wall 320, the depth walls 330, or the side walls 340, thereby preventing the article 500 from slipping over the receiving part 310 of the platform 300. In this way, it is possible to prevent the article 500 from slipping to a position at which the safety members against overturning 350 cannot prevent the article 500 from overturning and falling.

Next, a description is given of overturning prevention performed by the safety members against overturning 350 of the platform 300, according to the present invention, configured as shown in FIGS. 2A to 2C.

Figure 7A:
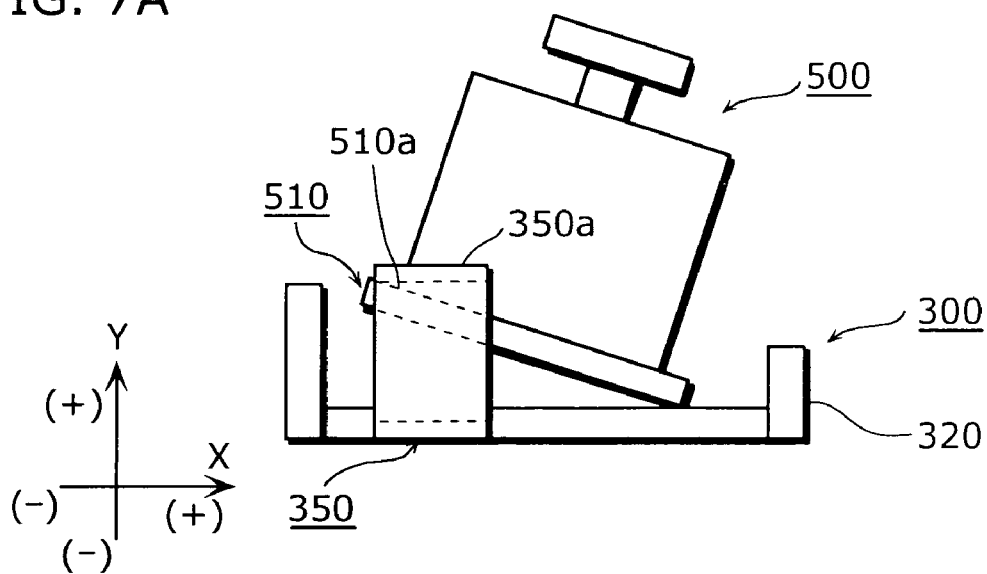
FIG. 7A is a diagram illustrating that the safety members against overturning of the platforms prevent overturning of the article, and positions at which the safety members against overturning are arranged.
Figure 7B:
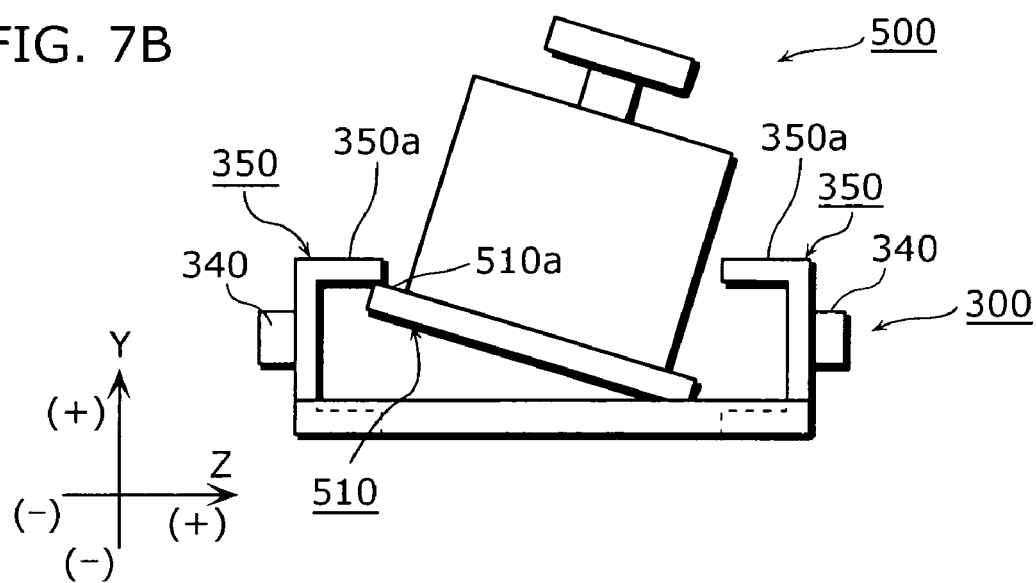
FIG. 7B is a diagram illustrating that safety members against overturning of the platform prevent overturning of the article, and positions at which the safety members against overturning are arranged.

Each of FIGS. 7A and 7B is a diagram illustrating that the safety members against overturning 350 of the platform 300 prevent overturning of the article, and positions at which the safety members against overturning 350 are arranged. For convenience, the side walls 340 are not shown in FIG. 7A, and the front wall 320 is not shown in FIG. 7B. Here, it is assumed that the transfer direction of the article 500 is the X-axis direction, the vertical direction is the Y-axis direction, and the direction perpendicular to the X-Y plane is the Z-axis direction.

As shown in FIG. 7A, the article 500 may tilt toward the front wall 320 when a great quake such as an earthquake occurs. More specifically, the article 500 tilts toward the front wall 320 such that the article 500 rotates about the axis of the peripheral side abutting the front wall 320 among the four peripheral sides of the bottom surface of the article 500.

Here, the tilt regulating part 350*a* of the safety member against overturning is placed such that they can regulate the tilt range of the article 500 mounted on the platform 300 by abutting the corresponding one of the abutting surfaces 510*a* of the article 500. In other words, the tilt regulating part 350*a* is placed such that it abuts the abutting surface 510*a* of the article 500 when the article 500 tilts by a predetermined angle. In this way, the position of the X-axis direction of the tilt regulating part 350*a* is determined based on the position of the abutting surface 510*a* at the time when the article 500 tilts. Likewise, the length of the X-axis direction of the tilt regulating part 350*a* is determined based on the position of the abutting surface 510*a* at the time when the article 500 tilts.

Here, the safety members against overturning 350 are arranged at positions in the depth direction of the platform 300 in the transfer direction. In other words, the safety members against overturning 350 are arranged such that it can prevent the article 500 from tilting in the direction of the front wall 320 and falling even when the tilt regulating part 350*a* is short in the X-axis direction.

Since the tilt regulating part 350*a* can prevent the article 500 from tilting by a predetermined angle or more, it can prevent the article 500 from overturning and falling.

FIG. 7B is a schematic side view of FIG. 7A when seen at the side of the front wall 320 (i.e. when seen from the right in FIG. 7A).

As shown in FIG. 7B, two tilt regulating parts 350*a* are positioned respectively in relation to the abutting surfaces 510*a* formed in relation to the side surfaces of the article 500. In this case, the article 500 may tilt toward either one of the safety members against overturning 350 when a great quake such as an earthquake occurs. More specifically, the article 500 tilts toward either one of the side walls 340 such that it rotates about the axis of the side abutting the side wall 340 among the four peripheral sides of the bottom surface of the article 500.

Here, each of the tilt regulating parts 350*a* of the safety members against overturning 350 is arranged such that it can regulate the tilt range of the article 500 mounted on the platform 300 by abutting the corresponding one of the abutting surfaces 510*a* of the article 500. In other words, the tilt regulating part 350*a* is arranged such that it abuts the abutting surface 510*a* of the article 500 when the article 500 tilts by a predetermined angle. In this way, the position of the Z-axis direction of the tilt regulating part 350*a* is determined based on the position of the abutting surface 510*a* at the time when the article 500 tilts. Likewise, the length of the Z-axis direction of the tilt regulating part 350*a* is determined based on the position of the abutting surface 510*a* at the time when the article 500 tilts.

Since the tilt regulating part 350*a* can prevent the article 500 from tilting by a predetermined angle or more, it can prevent the article 500 from overturning and falling.

Further, since the two safety members against overturning 350 are arranged opposite to each other sandwiching the article 500, each of them can prevent the article 500 from overturning and falling when the article 500 tilts toward the corresponding one of the side walls 340. Furthermore, even when the article 500 includes a single protruding part 510 protruding from the side abutting either one of the two side walls 340, the corresponding safety member against overturning 350 can prevent the article 500 from overturning and falling.

In this way, the safety members against overturning 350 of the platform 300 can prevent the article 500 from overturning and falling when a great quake such as an earthquake occurs. Although the article 500 mounted on the receiving part 310 may be swayed greatly because the receiving part 310 are suspended by the suspension parts 400, the safety members against overturning 350 can prevent the article 500 from overturning and falling even in such a case.

Further, when the article 500 is provided with the protruding part 510 at a position predetermined by standards or the like, it is possible to arrange the safety members against overturning 350 based on the position of the protruding part 510. In other words, the safety members against overturning 350 can prevent articles 500 having various shapes from overturning and falling as long as each article 500 has a protruding part 510 at the predetermined position.

Variation

A variation of the embodiment is described below. In the embodiment, the safety members against overturning 350 prevent overturning of an article 500 having a protruding part 510 at its lower-most part. In this variation, the safety members against overturning 350 are arranged at positions different from those in the embodiment in order to prevent overturning of an article 500 having a protruding part 510 at a position other than the lower-most part.

Figure 8A:
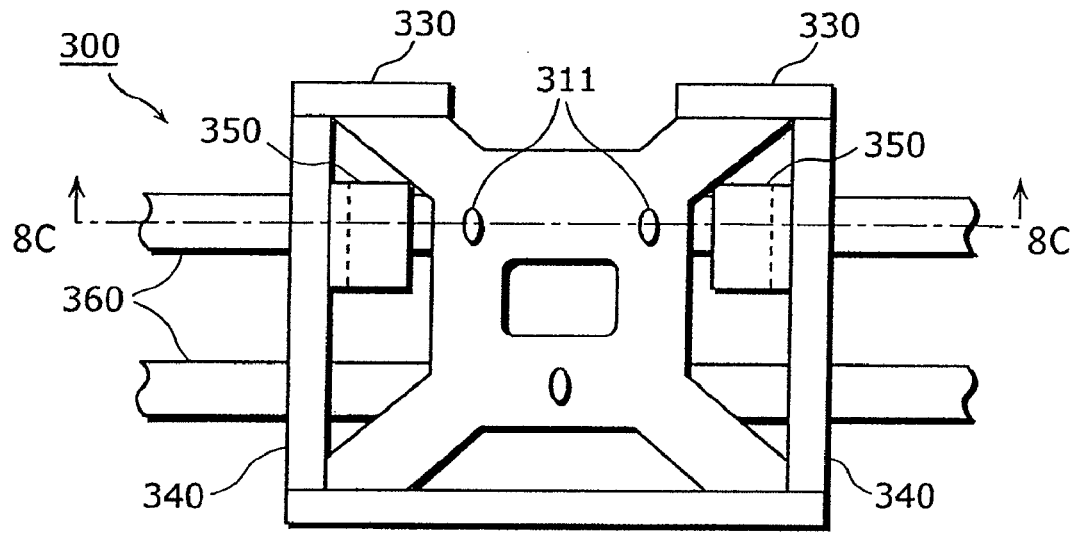
FIG. 8A is a diagram showing positions of safety members against overturning of the platform according to a variation of the embodiment.
Figure 8B:
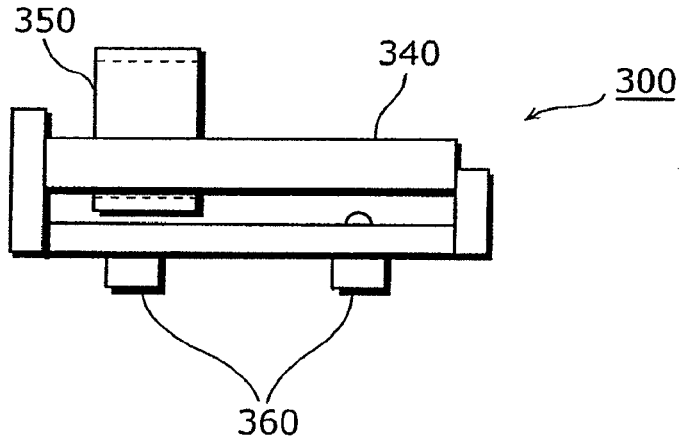
FIG. 8B is a diagram showing the position of one of the safety members against overturning of the platform according to the variation.
Figure 8C:
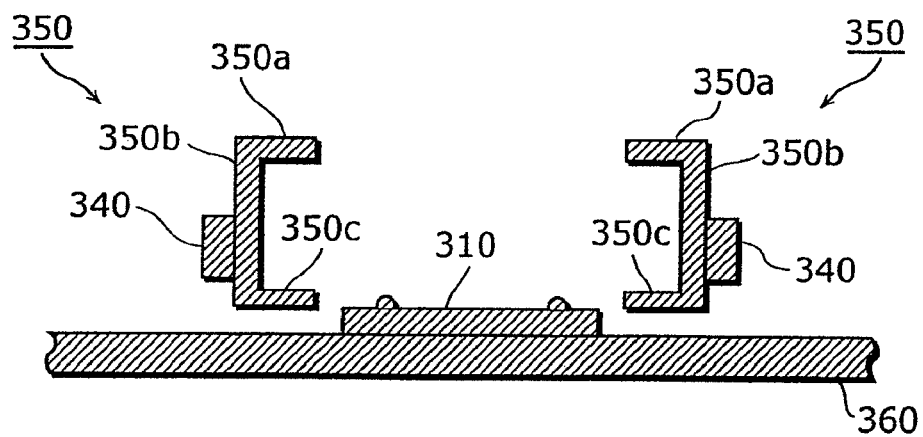
FIG. 8C is a diagram showing the positions of the safety members against overturning of the platform according to the variation.

Each of FIGS. 8A to 8C is a diagram showing the arrangement of the safety members against overturning 350 of the suspended platform 300 according to this variation.

FIG. 8A is a plan view schematically showing the arrangement of one of the safety members against overturning 350 of the platform 300 according to this variation.

As shown in FIG. 8A, the arrangement in FIG. 8A is the same as the arrangement in the embodiment described with reference to FIG. 2A.

FIG. 8B is a side view schematically showing the arrangement of the safety member against overturning 350 of the platform 300 according to this variation.

As shown in FIGS. 8B and 8C, the safety members against overturning 350 are arranged at positions higher than those in the embodiment described with reference to FIGS. 2A and 2B. In other words, in the embodiment, the safety members against overturning 350 are fixed on beams 360 and arranged such that the lower surfaces of the fixing parts 350c are flush with the lower surfaces of the receiving parts 310. However, in this variation, the respective safety members against overturning 350 are arranged such that the lower surfaces of the fixing parts 350c are arranged at positions higher than those of the lower surfaces of the receiving parts 310, and the fixing parts 350c are attached to the side walls 340, respectively.

Figure 9A:
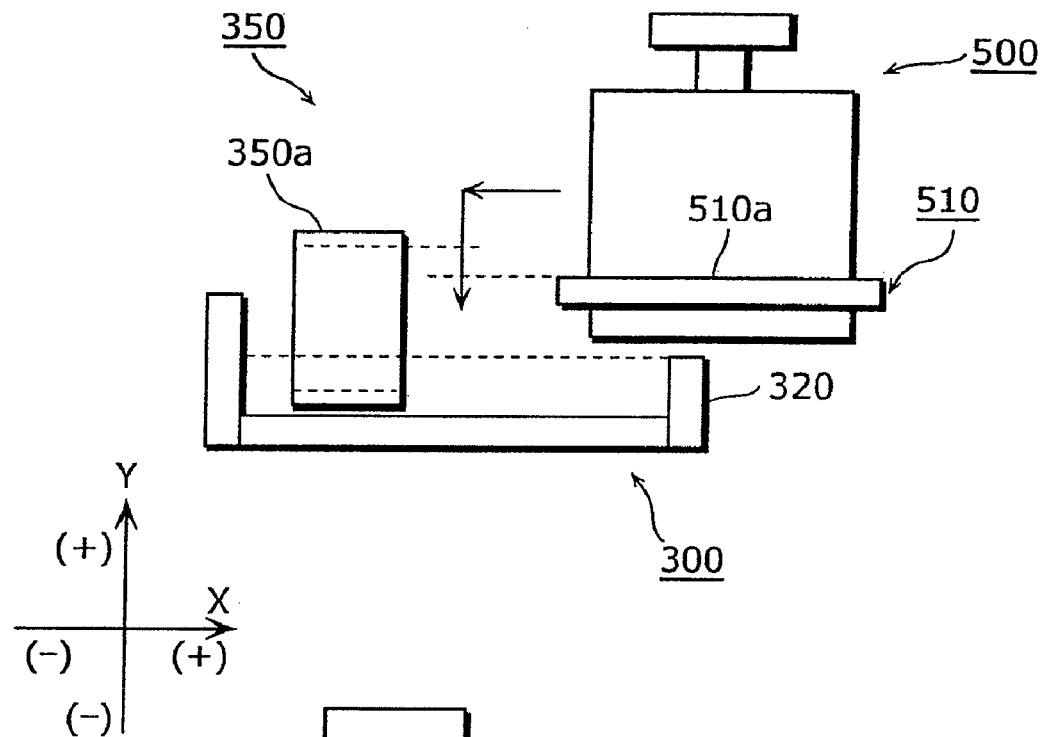
FIG. 9A is a diagram illustrating that the safety member against overturning of the platform prevents overturning of the article, and a position at which the safety member against overturning is placed.
Figure 9B:
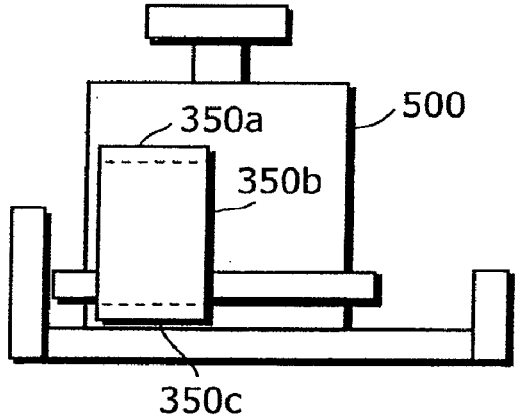
FIG. 9B is a diagram illustrating that the safety member against overturning of the platform prevents overturning of the article, and the position at which the safety member against overturning is placed.
Figure 9C:
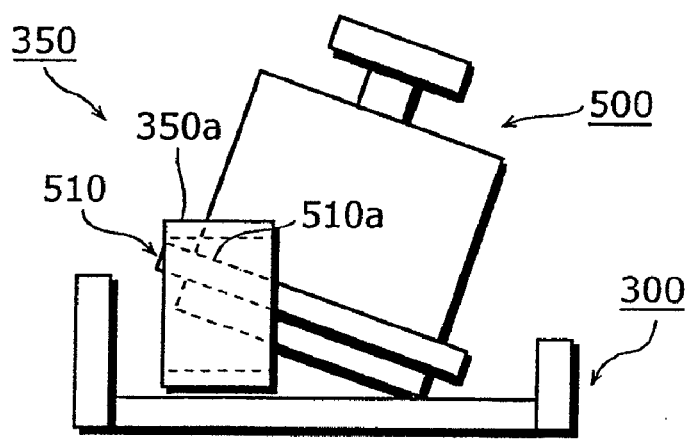
FIG. 9C is a diagram illustrating that the safety member against overturning of the platform prevents overturning of the article, and the position at which the safety member against overturning is placed.
Figure 10A:
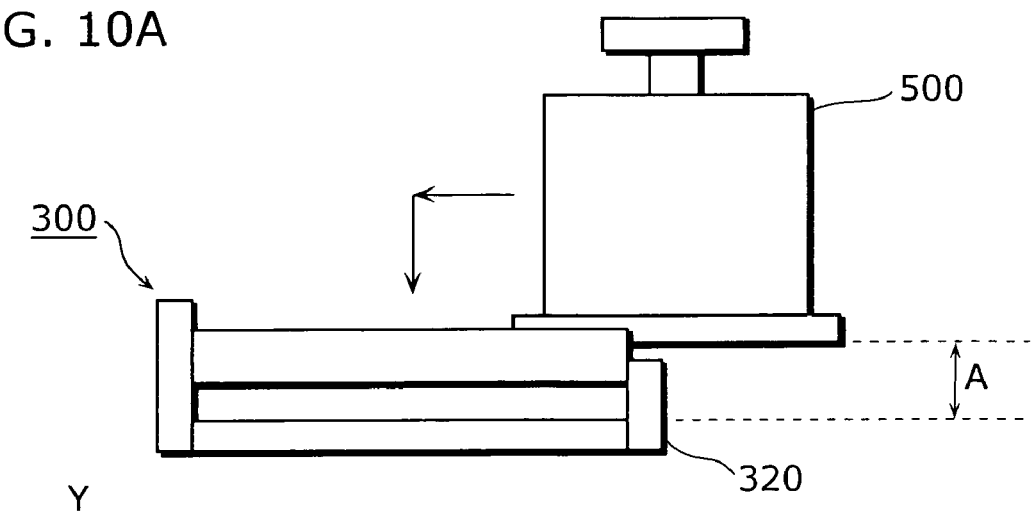
FIG. 10A is a diagram illustrating a problem of conventional platforms for an overhead traveling carriage.
Figure 10B:
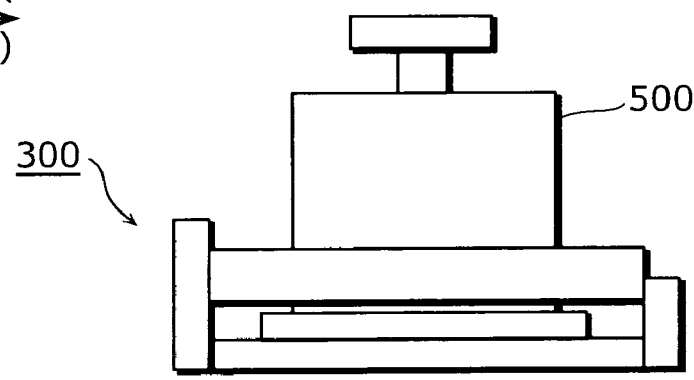
FIG. 10B is a diagram illustrating the problem of the conventional platforms for the overhead traveling carriage.
Figure 10C:
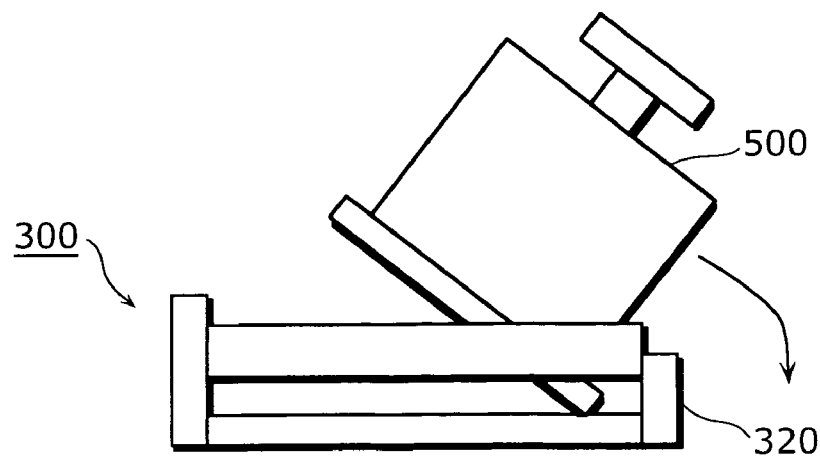
FIG. 10C is a diagram illustrating the problem of the conventional platforms for the overhead traveling carriage.

Each of FIGS. 9A to 9C is a diagram illustrating that the safety member against overturning 350 of the platform 300 prevents overturning of the article, and a position at which the safety member against overturning 350 is placed. For convenience, the side walls 340 are not shown in FIGS. 9A to 9C.

As shown in FIG. 9A, the article 500 has a protruding part 510 at the position appropriately higher than the lower-most part of the side surface. This protruding part 510 includes an upper surface including abutting surfaces 510a facing upward. The article 500 is stopped in front of the platform 300 through an operation performed by the traveling unit 110 of the overhead traveling carriage 100. The article 500 is placed such that the bottom surface of the article 500 is higher than the upper surface of the front wall 320 of the platform 300.

The article 500 is transferred, by an operation performed by the delivery unit 120 of the overhead traveling carriage 100, in the minus direction of the X-axis which approximately corresponds to the transfer direction on the horizontal plane. At this time, the safety members against overturning 350 are arranged above the abutting surfaces 510a of the article 500 while the article 500 is being transferred.

As shown in FIG. 9B, the article 500 is lowered in the minus direction of the Y-axis by the elevating unit 130, and mounted on the platform 300.

In this way, the tilt regulating parts 350a are positioned such that they do not touch the article 500 when the article 500 is transferred and mounted. Likewise, the tie parts 350b, and the fixing parts 350c are positioned such that they do not touch the article 500 when the article 500 is transferred and mounted.

As shown in FIG. 9C, the tilt regulating parts 350a are positioned such that each of them abuts the corresponding one of the abutting surfaces 510a of the protruding part 510 of the article 500 in the case where the article 500 tilts toward the front wall 320 or where the article 500 tilts toward the side walls 340. As in the case of FIGS. 7A and 7B, the positions and sizes of the tilt regulating parts 350a are determined based on the positions of the corresponding ones of the abutting surfaces 510a at the time when the article 500 tilts.

The tilt regulating parts 350a can prevent the article 500 from tilting by a predetermined angle in this way, and thus it can prevent the article 500 from overturning and falling.

The platforms 300 according to the present invention and the overhead traveling carriage 100 using the platforms 300 are described based on the embodiment and this variation, but the present invention is not limited to the embodiment and this variation.

Examples are provided below. The platforms 300 in the embodiment and this variation have two safety members against overturning 350, but it is also good that a single, or three or more safety members against overturning 350 is/are provided with the platforms 300.

The safety members against overturning 350 are U-shaped in the embodiment and this variation, but the shape is not limited to a U-shape as long as the safety members against overturning 350 can abut the abutting surface 510a of the protruding part 510 of the article 500, and thereby prevent falling of the article 500. Exemplary shapes include a shape formed only of a tilt regulating part 350a or of a tilt regulating part 350a and a tie part 350b. In addition, it is not necessary that the safety members against overturning 350 are plates which extend in the approximately horizontal direction, and the safety members against overturning 350 may have any other shapes as long as the safety members against overturning 350 can abut the abutting surface 510a of the protruding part 510 of the article 500, and thereby prevent falling of the article 500.

In the embodiment and this variation, each of the safety members against overturning 350 prevents the article 500 from overturning because its tilt regulating part 350a abuts the corresponding one of the abutting surfaces 510a of the protruding part 510 of the article 500. However, each of the safety members against overturning 350 prevents an article 500 from overturning because its tilt regulating part 350a abuts the corresponding one of the abutting surfaces 510a which are portions of the upper surface of the article 500 without any protruding part 510. These safety members against overturning 350 can prevent overturning of the article 500 even in the case of the article 500 without any protruding part 510.

In the embodiment and this variation, the safety members against overturning 350 are arranged at positions closer to the depth walls 330 than to the front wall 320 of the platforms 300. However, it is also good that the safety members against overturning 350 are arranged at positions closer to the front wall 320 than to the depth walls 330 of the platforms 300, or at the midpoint between the front wall 320 and the depth walls 330. In addition, the safety members against overturning 350 may be short or long in the depth direction. For example, the safety members against overturning 350 having the same length in the depth direction as that of the platforms 300 may be arranged.

The safety members against overturning 350 are rigid bodies in the embodiment and this variation, but they are not limited to rigid bodies. More specifically, each of the safety members against overturning 350 may be made of materials which transform to a certain degree as long as they can regulate the tilt range of the article 500 mounted on the platforms 300 by abutting the corresponding one of the abutting surfaces 510a of the article 500.

The receiving parts 310 of the respective platforms 300 have three convex portions 311 in the embodiment and this variation, but the number of convex portions 311 may be any including zero.

Although only a single exemplary embodiment and its variation of this invention have been described in detail above, those skilled in the art will readily appreciate that many modifications are possible in the exemplary embodiment and its variation without materially departing from the novel teachings and advantages of this invention. Accordingly, all such modifications are intended to be included within the scope of this invention.

The present invention is applicable as platforms on which articles conveyed by overhead traveling carriages are mounted, and in particular as platforms which can prevent articles from overturning and falling even when a great quake such as an earthquake occurs.

What is claimed is:

1. A suspended platform for receiving and supporting an article, which has an upwardly-facing abutting surface, upon the article being mounted on said suspended platform by an overhead traveling carriage that travels along a traveling rail fixed on a ceiling to transfer the article in a horizontal transfer direction, said suspended platform comprising:
    a receiving part on which the article is received and supported;
    a front wall supported by said receiving part at an entrance-and-exit portion of said receiving part where the article enters said suspended platform during mounting of the article on said suspended platform by the overhead traveling carriage, said front wall being configured to prevent falling of the article from said suspended platform; and
    a tilt regulating part fixed with respect to said receiving part and positioned relative to said receiving part and relative to said front wall such that, during mounting of the article by the overhead traveling carriage onto said receiving part in which the article is transferred horizontally and transverse to the horizontal transfer direction of the article, the article passes above said front wall of said suspended platform and the upwardly-facing abutting surface of the article passes beneath a downwardly-facing surface of said tilt regulating part so as not to contact the upwardly-facing abutting surface of the article against said downwardly-facing surface of said tilt-regulating part, and such that, with the article supported on said receiving part, tilting of the article beyond a predetermined tilt range of the article is prevented by contact of the upwardly-facing surface of the article against said downwardly-facing surface of said tilt regulating part.

2. The suspended platform according to claim 1, wherein wherein said receiving part, said front wall and said tilt regulating part are arranged so that, when the article is transferred horizontally and transverse to the horizontal transfer direction of the article, after passing above said front wall of said suspended platform to a position in which the upwardly-facing abutting surface of the article is located beneath said downwardly-facing surface of said tilt regulating part, the article can be lowered to rest on said receiving part in a location so that tilting of the article beyond the predetermined tilt range of the article is prevented by contact of the upwardly-facing abutting surface of the article against said downwardly-facing surface of said tilt regulating part.

3. The suspended platform according to claim 1, wherein said tilt regulating part is part of a safety member, said safety member further including a tie part fixed with respect to said receiving part to stand upwardly such that said safety member has an inverted L-shape and said tilt regulating part extends horizontally from an upper end of said tie part in a direction to be along the horizontal transfer direction.

4. The suspended platform according to claim 3, wherein said safety member further includes a plate-shaped fixing part fixed with respect to said receiving part;
said tilt regulating part is plate-shaped; and
said fixing part, said tie part and said tilt regulating part are integrally formed together to constitute said safety member.

5. The suspended platform according to claim 1, wherein said receiving part includes an upper surface having convex portions to be interfit with concave portions formed on a bottom surface of the article.

6. An apparatus comprising:
an article having an upwardly-facing abutting surface;
an overhead traveling carriage that travels along a traveling rail fixed on a ceiling to transfer said article in a horizontal transfer direction; and
a suspended platform for receiving and supporting said article, said suspended platform comprising
    a receiving part on which said article is received and supported,
    a front wall fixed with respect to said receiving part at an entrance-and-exit portion of said receiving part where said article enters said suspended platform during mounting of said article on said suspended platform by said overhead traveling carriage, said front wall being configured to prevent falling said article from said suspended platform, and
    a tilt regulating part fixed with respect to said receiving part and positioned relative to said receiving part and relative to said front wall such that, during mounting of said article by said overhead traveling carriage onto said receiving part in which said article is transferred horizontally and transverse to the horizontal transfer direction of said article, said article passes above said front wall of said suspended platform and said upwardly-facing abutting surface of said article passes beneath a downwardly-facing surface of said tilt regulating part so as not to contact said upwardly-facing abutting surface of said article against said downwardly-facing surface of said tilt-regulating part, and such that, with said article supported on said receiving part, tilting of said article beyond a predetermined tilt range of said article is prevented by contact of said upwardly-facing abutting surface of said article against said downwardly-facing surface of said tilt regulating part.

7. The apparatus according to claim 6, wherein
wherein said receiving part, said front wall and said tilt regulating part are arranged so that, when said article is transferred horizontally and transverse to the horizontal transfer direction of said article, after passing above said front wall of said suspended platform to a position in which said upwardly-facing abutting surface of said article is located beneath said downwardly-facing surface of said tilt regulating part, said article can be lowered to rest on said receiving part in a location so that tilting of said article beyond the predetermined tilt range of said article is prevented by contact of said upwardly-facing abutting surface of said article against said downwardly-facing surface of said tilt regulating part.

8. The apparatus according to claim 6, wherein
said tilt regulating part is part of a safety member, said safety member further including a tie part fixed with respect to said receiving part to stand upwardly such that said safety member has an inverted L-shape and said tilt regulating part extends horizontally from an upper end of said tie part in a direction along the horizontal transfer direction.

9. The apparatus according to claim 8, wherein
said safety member further includes a plate-shaped fixing part fixed with respect to said receiving part;
said tilt regulating part is plate-shaped; and
said fixing part, said tie part and said tilt regulating part are integrally formed together to constitute said safety member.

10. The apparatus according to claim 6, wherein
said article includes a protruding part formed on a side surface of said article; and
said upwardly-facing abutting surface of said article is constituted by an upwardly-facing surface of said protruding part.

11. The apparatus according to claim 10, wherein
said protruding part protrudes laterally from a bottom end portion of said article.

12. The apparatus according to claim 10, wherein
said protruding parts protrude laterally from a bottom end portion of said article.

13. The apparatus according to claim 6, wherein
said upwardly-facing abutting surface is one of two upwardly-facing abutting surfaces of said article;
said tilt regulating part is one of two tilt regulating parts fixed with respect to said receiving part; and
said two tilt regulating parts are positioned relative to said receiving part and relative to said front wall such that, during mounting of said article by said overhead traveling carriage onto said receiving part in which said article is transferred horizontally and transverse to the horizontal transfer direction of said article, said article passes above said front wall of said suspended platform and said upwardly-facing abutting surfaces of said article pass beneath downwardly-facing surfaces of said tilt regulating parts, respectively, so as not to contact said upwardly-facing abutting surfaces of said article, and such that, with said article supported on said receiving part, tilting of said article beyond a predetermined tilt range of said article is prevented by contact of said upwardly-facing abutting surfaces of said article against said downwardly-facing surfaces, respectively, of said tilt regulating part.

14. The apparatus according to claim 13, wherein
said article includes protruding parts formed on side surfaces of said article; and
said upwardly-facing abutting surfaces of said article are constituted by upwardly-facing surfaces, respectively, of said protruding part.

15. The apparatus according to claim 6, wherein
said article has concave portions formed on a bottom surface thereof;
said receiving part includes an upper surface having convex portions to be respectively interfit with said concave portions formed on the bottom surface of said article.

\* \* \* \* \*